(12) United States Patent
Lim et al.

(10) Patent No.: US 8,970,014 B2
(45) Date of Patent: Mar. 3, 2015

(54) SEMICONDUCTOR DEVICES WITH DIELECTRIC LAYERS

(71) Applicant: Samsung Electronics Co., Ltd., Suwon-Si, Gyeonggi-Do (KR)

(72) Inventors: Ha-jin Lim, Seoul (KR); Hyung-Suk Jung, Seoul (KR); Yun-Ki Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/020,021

(22) Filed: Sep. 6, 2013

(65) Prior Publication Data

US 2014/0001606 A1    Jan. 2, 2014

Related U.S. Application Data

(63) Continuation of application No. 12/385,287, filed on Apr. 3, 2009, now Pat. No. 8,557,713.

(30) Foreign Application Priority Data

May 23, 2008   (KR) .................. 10-2008-0048138

(51) Int. Cl.
*H01L 29/02*     (2006.01)

(52) U.S. Cl.
USPC .................... 257/635; 257/637; 257/E29.002

(58) Field of Classification Search
USPC .......................... 257/635, 637–646
See application file for complete search history.

(56) References Cited

U.S. PATENT DOCUMENTS

2007/0287254 A1*  12/2007  Natori et al. .................. 438/264
2008/0017954 A1*   1/2008  Suzuki et al. ................. 257/637
2008/0128833 A1    6/2008  Kawahara et al.

FOREIGN PATENT DOCUMENTS

| JP | 2006-066706 |   | 3/2006 |
| JP | 2007005365 | A | 1/2007 |
| JP | 2007088113 | A | 4/2007 |
| JP | 2008-028249 |   | 2/2008 |
| KR | 20050050003 | A | 5/2005 |
| KR | 20060034467 | A | 4/2006 |
| KR | 20060099105 | A | 9/2006 |
| KR | 10-2008-0038305 |   | 5/2008 |

* cited by examiner

*Primary Examiner* — Thanh Nguyen
(74) *Attorney, Agent, or Firm* — Harness, Dickey & Pierce, P.L.C.

(57) ABSTRACT

Semiconductor devices and methods of forming the semiconductor device are provided, the semiconductor devices including a first dielectric layer on a substrate, and a second dielectric layer on the first dielectric layer. The first dielectric layer has a carbon concentration lower than the second dielectric layer.

15 Claims, 6 Drawing Sheets

SEMICONDUCTOR DEVICES WITH DIELECTRIC LAYERS

PRIORITY STATEMENT

This application is a continuation application of and claims priority under 35 U.S.C. §120/121 to U.S. application Ser. No. 12/385,287 filed Apr. 3, 2009, which claims priority under 35 U.S.C. §119 of Korean Patent Application No. 2008-48138, filed on May 23, 2008 in the Korean Intellectual Property Office, which are herein incorporated by reference in their entirety.

BACKGROUND

1. Field

Example embodiments relate to semiconductor devices and/or methods of forming the same.

2. Description of Art

In semiconductor devices, a dielectric layer may be used as a gate insulating layer of a transistor or a capacitor insulating layer. In order for the dielectric layer to effectively function as a gate insulating layer or a capacitor insulating layer, the dielectric layer has to exhibit an adequate capacitance. Capacitance is proportional to a dielectric constant and an area of a dielectric layer, and is in inversely proportional to a thickness of a dielectric layer.

SUMMARY

Example embodiments relate to semiconductor devices and methods of forming the same.

A method of forming a semiconductor device according to example embodiments includes forming a first dielectric layer on a substrate and forming a second dielectric layer on the first dielectric layer. A carbon concentration in the first dielectric layer may be lower than a carbon concentration of the second dielectric layer.

Example embodiments provide a semiconductor device. The device may include a first dielectric layer on a substrate and a second dielectric layer on the first dielectric layer. A carbon concentration in the first dielectric layer may be lower than a carbon concentration of the second dielectric layer.

BRIEF DESCRIPTION OF THE FIGURES

Example embodiments will be more clearly understood from the following detailed description taken in conjunction with the accompanying drawings.

FIG. 1A is a view of a semiconductor device according to example embodiments;

FIG. 1B is an enlarged view of region "A" of the semiconductor device shown in FIG. 1A;

FIG. 2A is a view of a semiconductor device according to example embodiments;

FIG. 2B is an enlarged view of region "B" of the semiconductor device shown in FIG. 2A;

FIG. 3A is a view of a semiconductor device according to example embodiments;

FIG. 3B is an enlarged view of region "C" of the semiconductor device shown in FIG. 3A; and FIGS. 4 through 8 are views illustrating a method of forming a semiconductor device according to example embodiments.

DETAILED DESCRIPTION OF EXAMPLE EMBODIMENTS

Figure 1A:
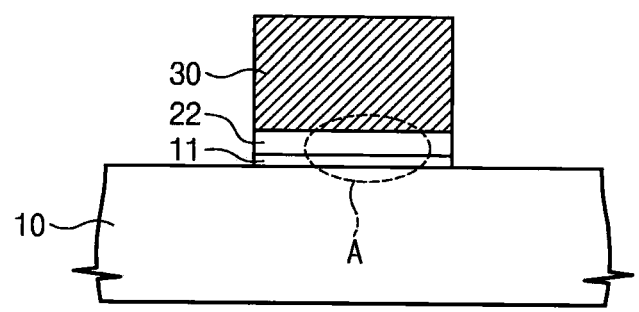
FIGS. 1A, 1B, 2A, 2B, 3A, 3B and 4-8 represent non-limiting, example embodiments as described herein.

Example embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/."

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, for example, manufacturing. For example, a region illustrated as a rectangle may have rounded or curved features. Thus, the regions illustrated in the figures are schematic in nature and are not intended to limit the scope of the present invention.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

Example embodiments relate to semiconductor devices and/or methods of forming the same.

Figure 1B:
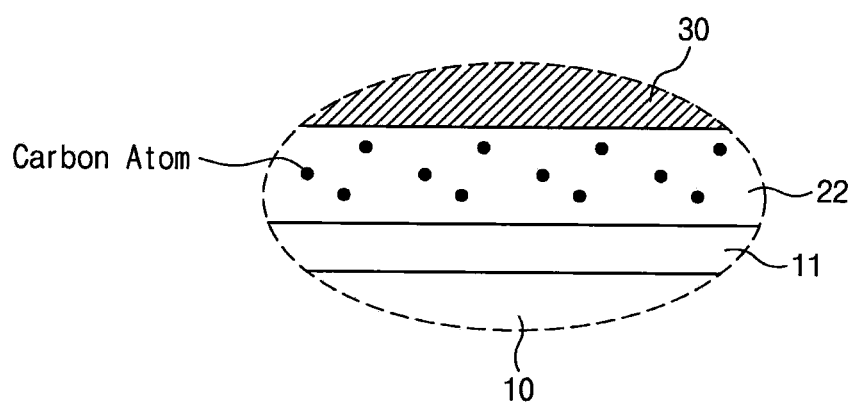

FIG. 1A is a view of a semiconductor device according to example embodiments. FIG. 1B is an enlarged view of region "A" of the semiconductor device shown in FIG. 1A.

Referring to FIGS. 1A and 1B, a semiconductor device according to example embodiments will now be described.

A gate electrode 30 may be provided on (or over) a substrate 10. The substrate 10 may be a single crystalline silicon layer, silicon-on-insulator (SOI) or a polysilicon layer. However, example embodiments are not limited thereto. The substrate 10 may include a conductive region and/or an insulating region. For example, the substrate 10 may include an impurity region including source/drain regions. The gate electrode 30 may include a conductive material. For example, the gate electrode 30 may include a polysilicon having dopants.

A dielectric layer 22 may be provided between the substrate 10 and the gate electrode 30. The dielectric layer 22 may be a layer having a high dielectric constant. The dielectric layer 22 may be a metal oxide layer, a metal silicon oxide layer and/or a metal silicon oxynitride layer including at least one element selected from the group consisting of hafnium (Hf), zirconium (Zr), aluminum (Al), titanium (Ti), lanthanum (La), yttrium (Y), gadolinium (Gd), tantalum (Ta) and combinations thereof. The dielectric layer 22 may have a non-uniform profile of a carbon concentration throughout the dielectric layer 22. The dielectric layer 22 may have the lowest carbon concentration at a region adjacent to the substrate 10. For example, the dielectric layer 22 may have the highest carbon concentration at a center part of the dielectric layer 22 and the lowest carbon concentration at an edge of the dielectric layer 22. In another example, the dielectric layer 22 may have a higher carbon concentration in the region farthest apart from the substrate 10 (e.g., the region of the dielectric layer 22 near the surface contacting the gate electrode 30.

An oxide layer 11 may be provided between the substrate 10 and the dielectric layer 22. The oxide layer 11 may be a silicon oxide layer, a silicon oxynitride layer or combinations thereof. The oxide layer 11 may have a thickness smaller than the dielectric layer 22. For example, a thickness ratio of the oxide layer 11 to the dielectric layer 22 may be about 1:1.5 to about 1:3 (thickness of the oxide layer:thickness of the dielectric layer).

Figure 2A:
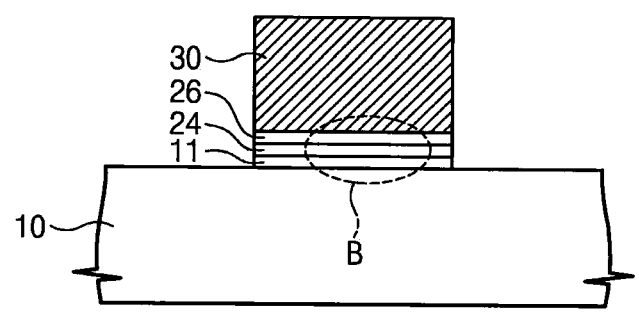
Figure 2B:
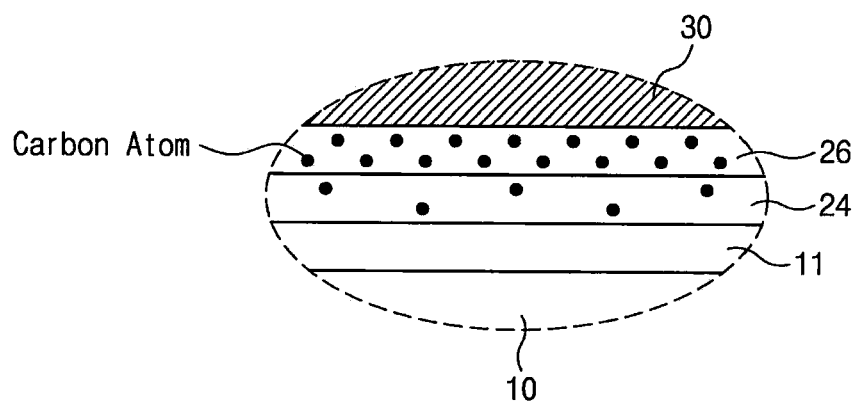

FIG. 2A is a view of a semiconductor device according to example embodiments. FIG. 2B is an enlarged view of region "B" of the semiconductor device shown in FIG. 2A.

Referring to FIGS. 2A and 2B, a semiconductor device according to example embodiments will be described.

A gate electrode 30 may be provided onto a substrate 10. A first dielectric layer 24 and a second dielectric layer 26 may be provided between the substrate 10 and the gate electrode 30. The first and second dielectric layers 24 and 26 may have substantially high dielectric constants. The first dielectric constant 24 may be disposed on the substrate 10, and the second dielectric layer 26 may be disposed on the first dielectric layer 24.

The first dielectric layer 24 is a layer having a substantially high dielectric constant. The first dielectric layer 24 may be a metal oxide layer, a metal silicon oxide layer and/or a metal silicon oxynitride layer including at least one selected from the group consisting of Hf, Zr, Al, Ti, La, Y, Gd, Ta and combinations thereof.

The second dielectric layer 26 is a layer having a substantially high dielectric constant. The second dielectric layer 26 may be a metal oxide layer, a metal silicon oxide layer and/or a metal silicon oxynitride layer including at least one selected from the group consisting of Hf, Zr, Al, Ti, La, Y, Gd, Ta and combinations thereof. The carbon concentration in the second dielectric layer 26 may be higher than the carbon concentration in the first dielectric layer 24. The carbon concentration in the second dielectric layer 26 may be about 3% or less.

The first and second dielectric layers 24 and 26 may include different materials, respectively. For example, the first dielectric layer 24 may include a metal silicon oxide, and the second dielectric layer 26 may include a metal oxide. Alternatively, the first and second dielectric layers 24 and 26 may be a metal oxide layer or a metal silicon oxide layer, respectively, including different metals.

An oxide layer 11 may be provided between the substrate 10 and the first dielectric layer 24. The oxide layer 11 may be a silicon oxide layer, a silicon oxynitride layer or combinations thereof. The oxide layer 11 may have a thickness smaller than the dielectric layers 24 and 26. For example, the oxide layer 11 have a thickness smaller than the dielectric layer 24, the dielectric layer 26 or the sum of the dielectric layer 24 and 26.

Figure 3A:
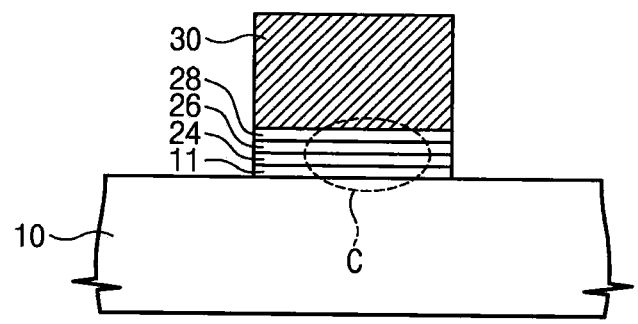
Figure 3B:
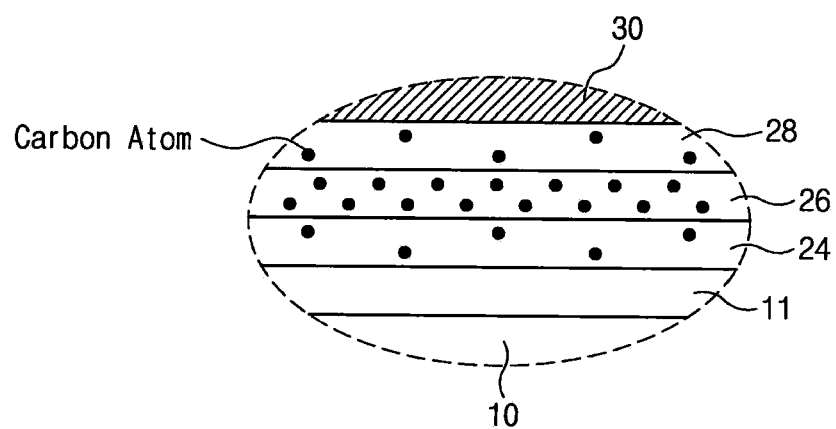

FIG. 3A a view of a semiconductor device according to example embodiments. FIG. 3B is an enlarged view of region "C" of the semiconductor device shown in FIG. 3A.

Referring to FIGS. 3A and 3B, a semiconductor device according to example embodiments will be described.

A gate electrode 30 may be provided onto a substrate 10. The substrate 10 may include a conductive region and/or an insulating layer.

First, second and third dielectric layers 24, 26 and 28 may be provided between the substrate 10 and the gate electrode 30. The first dielectric layer 24 may be adjacent to the substrate 10, and the third dielectric layer 28 may be adjacent to the gate electrode 30. The second dielectric layer 26 may be disposed between the first dielectric layer 24 and the third dielectric layer 28.

The third dielectric layer 28 is a layer having a substantially high dielectric constant. The third dielectric layer 28 may be a metal oxide layer, a metal silicon oxide layer and/or a metal silicon oxynitride layer including at least one selected from the group consisting of Hf, Zr, Al, Ti, La, Y, Gd, Ta and combinations thereof. A carbon concentration in the third dielectric layer 28 may be lower than a carbon concentration in the second dielectric layer 26.

An oxide layer 11 may be provided between the substrate 10 and the first dielectric layer 24. The oxide layer 11 may be a silicon oxide layer, a silicon oxynitride layer or combinations thereof. The oxide layer 11 may have a thickness smaller than a sum of thicknesses of the dielectric layers 24, 26 and 28.

FIGS. 4 through 8 are views illustrating a method of forming a semiconductor device according to example embodiments.

Referring to FIGS. 4 through 8, a method of forming a semiconductor device according example embodiments will now be described. FIGS. 4 through 8 are diagrams of a gas injection if a dielectric layer according to example embodiments is formed by an atomic layer deposition (ALD).

Figure 4:
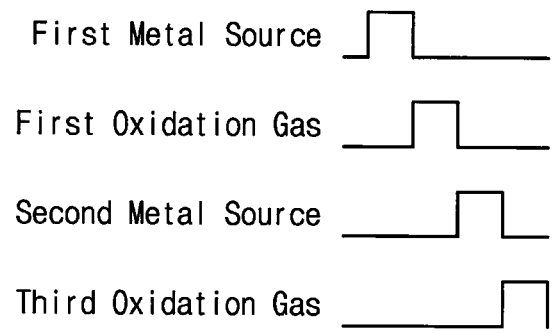

Referring to FIGS. 4, 1A and 1B, a method of forming a semiconductor device according to example embodiments will be described.

A substrate 10 is loaded in a reactor. A first metal source is injected into the reactor. The first metal source may be an inorganic metal compound. The first metal source may be a metal halide inorganic compound including at least one metal selected from the group consisting of Hf, Zr, Al, Ti, La, Y, Gd, Ta and combinations thereof. The metal halide inorganic compound may not include carbon. The metal halide inorganic compound may include at least one halogen atom. The first metal source may be $HfCl_4$, $ZrCl_4$, $ZrBr_4$, $HfI_4$, $ZrI_4$ or combinations thereof. After the first metal source is injected, a purge gas may be injected. The purge gas may purge any of the first metal source which remains and is not absorbed on the substrate to the outside of the reactor.

A first oxidation gas may be injected into the reactor. The first oxidation gas may be ozone ($O_3$), an oxygen (O) radical, water ($H_2O$), hydrogen peroxide ($H_2O_2$) or combinations thereof. After the first oxidation gas is injected, a purge gas may be injected.

A second metal source is injected in the reactor. The second metal source may be an organic metal compound including at least one of Hf, Zr, Al, Ti, La, Y, Gd, Ta or combinations thereof. The second metal source may be a metal compound including at least one carbon atom. For example, the second metal source may be at least one of $Hf[N(CH_3)_2]_4$, $Hf[N(CH_3)(C_2H_5)]_4$, $Hf[N(C_2H_5)]_4$, $Hf[OCH_3]_4$, $Hf[OC_2H_5]_4$, $Zr[N(CH_3)_2]_4$, $Zr[N(CH_3)(C_2H_5)]_4$, $Zr[N(C_2H_5)]_4$, $Zr[OCH_3]_4$, $Zr[OC_2H_5]_4$ or combinations thereof. After the second metal source is injected, a purge gas may be injected.

The first metal source and the second metal source may be metal compounds including a same metal. For example, the first metal source may be a hafnium compound not including carbon, and the second metal source may be a hafnium compound including carbon.

A third oxidation gas may be injected into the reactor. The third oxidation gas may be $O_3$, O radical, $H_2O$, $H_2O_2$ or combinations thereof. After the third oxidation gas is injected, a purge gas may be injected. The dielectric layer 22 may be formed to have the lowest carbon concentration at (or in) a region adjacent to the substrate 10.

After second metal source is injected, the first metal source, the first oxidation gas and a purge gas may be injected (or removed). The dielectric layer 22 may have the highest carbon concentration at a central part. A carbon concentration at both edges of the dielectric layer 22 may be lower than the carbon concentration at the central part of the dielectric layer 22.

The first and second metal sources, and the first and third oxidation gases may be injected several times (or repeatedly). The second metal source and the third oxidation gas may be injected several times after the first metal source and the first oxidation gas are injected several times. For example, the first and second metal sources, and the first and third oxidation gases may be injected in the following order: the first metal source$_l$→the first oxidation gas$_m$→the second metal source$_n$→the third oxidation gas$_o$ (wherein l, m, n and o represent a number of injections and are a natural number (or integer) of 1 or more). After the first metal source and the first oxidation gas are alternately injected several times, the second metal source and the third oxidation gas may be alternately injected several times. For example, the first and second metal sources, and the first and third oxidation gases may be injected in the following order: (the first metal source→the first oxidation gas)$_x$→(the second metal source→the third oxidation gas)$_y$ (wherein x and y represent a number of injections and are a natural number (or integer) of 1 or more). The number of times each step is repeated may be controlled depending on desired features (e.g., thickness, concentration, etc.) of the layer to be formed.

A dielectric layer 22 may be formed by injecting the first and second metal sources, and the first and third oxidation gases. The dielectric layer 22 may be a metal oxide layer or a metal silicon oxide layer. The dielectric layer 22 may be formed such that a region adjacent to the substrate 10 has the lowest carbon concentration.

A subsequent process may be performed during or after formation of the dielectric layer 22. In the subsequent process, a portion of the carbons located on an upper portion of the dielectric layer 22 may be diffused into a lower portion of the dielectric layer 22. An oxide layer 11 may be formed between the dielectric layer 22 and the substrate 10 depending on conditions of the subsequent process. The oxide layer 11 may be at least one of a silicon oxide layer, a silicon oxynitride or combinations thereof.

A gate electrode 30 is formed on the dielectric layer 22. A polysilicon layer (not shown) is formed on the dielectric layer 22. The polysilicon layer is patterned to form the gate electrode 30. However, a method of forming the gate electrode 30 is not limited to the aforementioned method.

Figure 5:
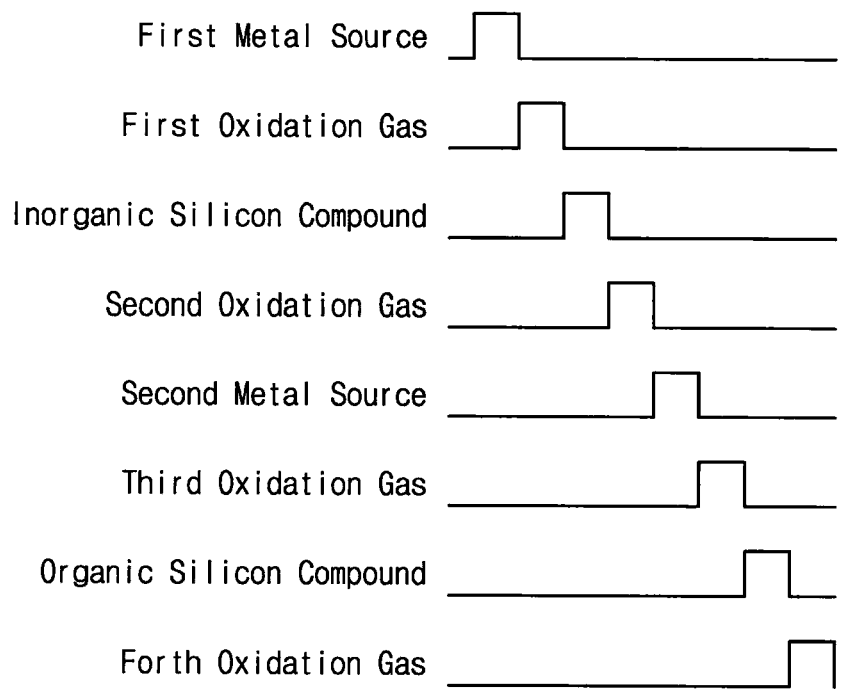

Referring to FIGS. 5, 1A and 1B, another method of forming a semiconductor device according to example embodiments will now be described. A substrate 10 is loaded in a reactor. A first metal source may be injected into the reactor. The first metal source may be a metal halide inorganic compound including at least one selected from the group consisting of Hf, Zr, Al, Ti, La, Y, Gd, Ta and combinations thereof. For example, the first metal source may be at least one of $HfCl_4$, $ZrCl_4$, $ZrBr_4$, $HfI_4$, $ZrI_4$ or combinations thereof. After the first metal source is injected, a purge gas may be injected.

A first oxidation gas may be injected into the reactor. The first oxidation gas may be at least one of $O_3$, O radical, $H_2O$, $H_2O_2$ or combinations thereof. After the first oxidation gas is injected, a purge gas may be injected.

An inorganic silicon compound may be injected into the reactor. The inorganic silicon compound may be a silicon compound not including carbon. The inorganic silicon compound may be injected in the form of a gas. The inorganic silicon compound may be halide silane or halide disilane including at least one of $SiCl_4$, $SiCl_6$, $SiCl_2H_4$, $SiF_4$ or combinations thereof. After the inorganic silicon compound is injected into the reactor, a purge gas may be injected.

A second oxidation gas may be injected into the reactor. The second oxidation gas may be at least one of $O_3$, O radical, $H_2O$, $H_2O_2$ or combinations thereof. After the second oxidation gas is injected, a purge gas may be injected.

The first metal source, the first oxidation gas, the inorganic silicon compound and the second oxidation gas may be injected several times. After the first metal source and the first oxidation gas are injected several times, the inorganic silicon compound and the second oxidation gas may be injected several times. For example, the first metal source, the first and second oxidation gases, and the inorganic silicon compound may be injected in the following order: the first metal source$_l$→the first oxidation gas$_m$→the inorganic silicon compound$_n$→the second oxidation gas$_o$ (wherein l, m, n and o represent a number of injections and are a natural number (or integer) of 1 or more). After the first metal source and the first oxidation gas are alternately injected several times, the inorganic silicon compound and the second oxidation gas may be alternately injected several times. For example, the first metal source, the first and second oxidation gases, and the inorganic silicon compound may be injected in the following order: (the first metal source→the first oxidation gas)$_x$→(the inorganic silicon compound→the second oxidation gas)$_y$ (wherein x and y represent a number of injections and are a natural number (or integer) of 1 or more). The number of times the first metal source is injected may be greater than the number of times the inorganic silicon compound is injected. An alternate injection of the first metal source, the first oxidation gas, the inorganic silicon compound and the second oxidation gas may be repeatedly performed. For example, a sequence (q) of the first metal source, the first oxidation gas, the inorganic silicon compound and the second oxidation gas may be repeated in the following order: (the first metal source$_l$→the first oxidation gas$_m$→the inorganic silicon compound$_n$→the second oxidation gas$_o$)$_q$ (wherein l, m, n, o and q represent a number of repetitions and are a natural number (or integer) of 1 or more). An alternate sequence (z) of the first metal source, the first oxidation gas, the inorganic silicon compound and the second oxidation gas may be repeated in the following order: {(the first metal source→the first oxidation gas)$_x$→(the inorganic silicon compound→the second oxidation gas)$_y$}$_z$ (wherein x, y and z represent a number of repetitions and are a natural number (or integer) of 1 or more). The number of times each step is repeated may be controlled depending on the desired features of the layer to be formed.

A second metal source may be injected in the reactor. The second metal source may be an organic metal compound including at least one metal selected from the group consisting of Hf, Zr, Al, Ti, La, Y, Gd, Ta or combinations thereof. The organic metal compound may be a metal compound including at least one carbon atom. For example, the second metal source may be at least one of $Hf[N(CH_3)_2]_4$, $Hf[N(CH_3)(C_2H_5)]_4$, $Hf[N(C_2H_5)]_4$, $Hf[OCH_3]_4$, $Hf[OC_2H_5]_4$, $Zr[N(CH_3)_2]_4$, $Zr[N(CH_3)(C_2H_5)]_4$, $Zr[N(C_2H_5)]_4$, $Zr[OCH_3]_4$, $Zr[OC_2H_5]_4$ or combinations thereof. After the second metal source is injected, a purge gas may be injected.

The first metal source and the second metal source may be metal compounds including a same metal. For example, the first metal source may be a hafnium compound not including carbon, and the second metal source may be a hafnium compound including carbon.

A third oxidation gas may be injected into the reactor. The third oxidation gas may be at least one of $O_3$, O radical, $H_2O$, $H_2O_2$ or combinations thereof. After the third oxidation gas is injected, a purge gas may be injected.

An organic silicon compound may be injected into the reactor. The organic silicon compound may be a silicon compound including at least one carbon atom. The organic silicon compound may be a compound having an alkyl amino group including $SiH_n(NR_1R_2)_{4-n}$ (wherein 0≤n<4). $R_1$ and $R_2$ may each independently be at least one selected from a group consisting of an alkyl, an allyl and combinations thereof. After the organic silicon compound is injected, a purge gas may be injected into the reactor.

A fourth oxidation gas may be injected into the reactor. The fourth oxidation gas may be at least one of $O_3$, O radical, $H_2O$, $H_2O_2$ or combinations thereof. After the fourth oxidation gas is injected, a purge gas may be injected.

The second metal source, the third oxidation gas, the organic silicon compound and the fourth oxidation gas may be injected several times. After the second metal source and the third oxidation gas are injected several times, the organic silicon compound and the fourth oxidation gas may be injected several times. For example, the second metal source, the third and fourth oxidation gases, and the organic silicon compound may be injected in the following order: the second metal source$_l$→the third oxidation gas$_m$→the organic silicon compound$_n$→the fourth oxidation gas$_o$ (wherein l, m, n and o represent a number of injections and are a natural number (or integer) of 1 or more). After the second metal source and the third oxidation gas are alternately injected several times, the organic silicon compound and the fourth oxidation gas may be alternately injected several times. For example, the second metal source, the third and fourth oxidation gases, and the organic silicon compound may be injected in the following order: (the second metal source→the third oxidation gas)$_x$→(the organic silicon compound→the fourth oxidation gas)$_y$ (wherein x and y represent a number of injections and are a natural number (or integer) of 1 or more). The number of times the second metal source is injected may be greater than the number of times the organic silicon compound is injected. An alternate injection of the second metal source, the third oxidation gas, the organic silicon compound and the fourth oxidation gas may be repeatedly performed. For example, a sequence (q) of the second metal source, the third oxidation gas, the organic silicon compound and the fourth oxidation gas may be repeated in the following order: (the second metal source$_l$→the third oxidation gas$_m$→the organic silicon compound$_n$→the fourth oxidation gas$_o$)$_q$ (wherein l, m, n, o and q represent a number of repetitions and are natural number (or integer) of 1 or more). An alternate sequence (z) of the second metal source, the third oxidation gas, the organic silicon compound and the fourth oxidation gas may be repeated in the following order: {(the second metal source→the third oxidation gas)$_x$→(the organic silicon compound→the fourth oxidation gas)$_y$}$_z$ (wherein x, y and z represent a number of repetitions and are natural number (or integer) of 1 or more). The number of times each step is repeated may be controlled depending on desired features of the layer to be formed.

A dielectric layer 22 may be formed by injection of the first and second metal sources, the first, second, third and fourth oxidation gases, the inorganic silicon compound, and the organic silicon compound. The dielectric layer 22 may be a metal silicon oxide layer. The dielectric layer 22 may be formed such that a region adjacent to the substrate 10 has the lowest carbon concentration.

A subsequent process may be performed during or after formation of the dielectric layer 22. An oxide layer 11 may be formed between the dielectric layer 22 and the substrate 10 depending on conditions of the subsequent process. The oxide layer 11 may be a silicon oxide layer, a silicon oxynitride or combinations thereof.

A gate electrode 30 may be formed on the dielectric layer 22. After polysilicon layer is formed on the dielectric layer 22, the polysilicon layer is patterned to form the gate electrode 30. However, a method of forming the gate electrode 30 is not limited to an aforementioned method.

Referring to FIGS. 4, 2A and 2B, another method of forming a semiconductor device according to example embodiments will be described. A substrate 10 is loaded in a reactor. A first metal source may be injected into the reactor. The first metal source may be metal halide inorganic compound including at least one metal selected from the group consisting of at least one of Hf, Zr, Al, Ti, La, Y, Gd, Ta and combinations thereof. For example, the first metal source may be $HfCl_4$, $ZrCl_4$, $ZrBr_4$, $HfI_4$, $ZrI_4$ or combinations thereof. After the first metal source is injected, a purge gas may be injected.

A first oxidation gas may be injected into the reactor. The first oxidation gas may be at least one of $O_3$, O radical, $H_2O$, $H_2O_2$ or combinations thereof. After the first oxidation gas is injected, a purge gas may be injected. A first dielectric layer 24 may be formed on the substrate 10 by an injection of the first metal source and the first oxidation gas. The first dielectric layer 24 may be a metal oxide layer.

The first metal source and the first oxidation gas may be injected several times. For example, after the first metal source is injected several times, the first oxidation gas may be injected several times (the first metal source$_l$→the first oxidation gas$_m$) (wherein l and m represent a number of injections and are natural number (or integer of) 1 or more). In another example, the first metal source and the first oxidation gas may be alternately injected several times (the first metal source→the first oxidation gas)$_x$ (wherein x represents a number of injection and is natural number (or integer) of 1 or more). A ratio of metal to oxygen in the layer may differ depending on the number of times the first metal source and the first oxidation gas are injected. A thickness of the first dielectric layer 24 may be controlled by controlling the number of times the first metal source and the first oxidation gas are injected.

The first dielectric layer 24 may be formed by a method capable of controlling a carbon concentration in the layer. For example, the first dielectric layer 24 may be formed by a chemical vapor deposition and may be formed using a precursor not including carbon. In another example, the first dielectric layer 24 may use an inorganic metal compound as a precursor and may be formed with a lower carbon concentration by controlling the first oxidation gas or an addition gas. If the first dielectric layer 24 is formed, a portion of the organic metal compound may be injected but a carbon concentration in the layer may be lower by controlling the first oxidation gas or an addition gas. The first oxidation gas may be $O_3$, and the addition gas may include nitrogen.

After the first metal source and the first oxidation gas are injected, a subsequent process may be performed. An oxide layer 11 may be formed between the first dielectric layer 24 and the substrate 10 during the subsequent process. Depending on conditions of the subsequent process, the oxide layer 11 may be at least one of a silicon oxide layer, a silicon oxynitride or combinations thereof.

A second metal source may be injected in the reactor. The second metal source may be an organic metal compound including at least one of Hf, Zr, Al, Ti, La, Y, Gd, Ta or combinations thereof. The organic metal compound may be a metal compound including at least one carbon atom. For example, the second metal source may be at least one of $Hf[N(CH_3)_2]_4$, $Hf[N(CH_3)(C_2H_5)]_4$, $Hf[N(C_2H_5)]_4$, $Hf[OCH_3]_4$, $Hf[OC_2H_5]_4$, $Zr[N(CH_3)_2]_4$, $Zr[N(CH_3)(C_2H_5)]_4$, $Zr[N(C_2H_5)]_4$, $Zr[OCH_3]_4$, $Zr[OC_2H_5]_4$ or combinations thereof. After the second metal source is injected, a purge gas may be injected.

A third oxidation gas is injected into the reactor. The third oxidation gas may be at least one of $O_3$, O radical, $H_2O$, $H_2O_2$ or combinations thereof. After the third oxidation gas is injected, a purge gas may be injected.

The second metal source and the third oxidation gas may be injected several times. After the second metal source is injected several times, the third oxidation gas may be injected several times. For example, the second metal source and the third oxidation gas may be injected in the following order: the second metal source$_l$→the third oxidation gas$_m$ (wherein l and m represent a number of injections and are natural number (or integer) of 1 or more). Alternatively, the second metal source and the third oxidation gas may be alternately injected several times. For example, the second metal source and the third oxidation gas may be injected in the following order: (the second metal source→the third oxidation gas)$_x$ (wherein x is represents a number of injections and is natural number (or integer) of 1 or more). The number of times each step is performed may be controlled (or adjusted for) by desired features of the dielectric layer.

The second dielectric layer 26 is formed on the first dielectric layer 24 by injecting the second metal source and the third oxidation gas. The second dielectric layer 26 may be a metal oxide layer.

Alternatively, the second dielectric layer 26 may be formed using a well-known method of forming a thin film including a chemical vapor deposition (CVD) method, a metal organic chemical vapor deposition (MOCVD) method or similar method.

A subsequent process may be performed before or after formation of the second dielectric layer 26. An oxide layer 11 may be formed between the first dielectric layer 24 and the substrate 10 depending on conditions of the subsequent process. The oxide layer 11 may be at least one of a silicon oxide layer, a silicon oxynitride layer or combinations thereof.

A gate electrode 30 is formed on the second dielectric layer 26. After polysilicon layer (not shown) is formed on the second dielectric layer 26, the polysilicon layer is patterned to form the gate electrode 30. However, a method of forming the gate electrode 30 is not limited to an aforementioned method.

Figure 6:
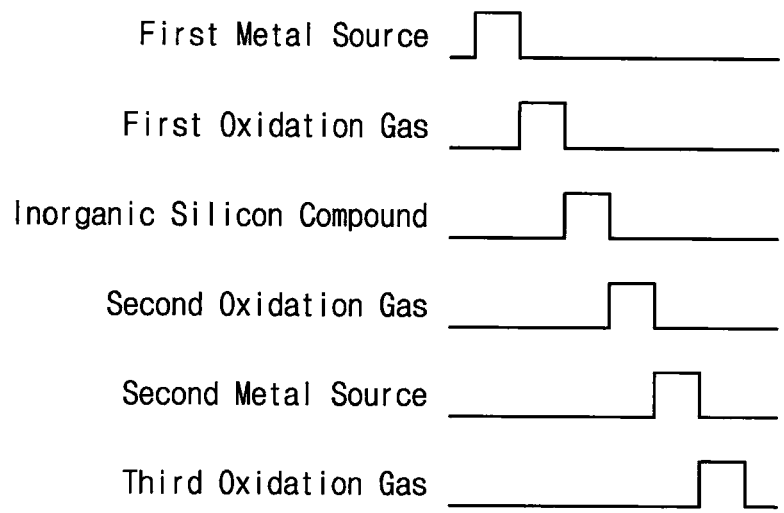

Referring to FIGS. 6, 2A and 2B, another method of forming a semiconductor device according to example embodiments will be described. A substrate 10 is loaded in a reactor. A first metal source and a first oxidation gas are injected into the reactor. After the first metal source is injected and after the first oxidation gas is injected, a purge gas may be injected.

The first metal source may be a metal halide inorganic compound including at least one metal selected from the group consisting of Hf, Zr, Al, Ti, La, Y, Gd, Ta and combinations thereof. For example, the first metal source may be at least one of $HfCl_4$, $ZrCl_4$, $ZrBr_4$, $HfI_4$, $ZrI_4$ or combinations thereof. The first oxidation gas may be at least one of $O_3$, O radical, $H_2O$, $H_2O_2$ or combinations thereof.

An inorganic silicon compound is injected into the reactor. The inorganic silicon compound is a silicon compound not including carbon and may be injected in the form of a gas. The inorganic silicon compound may be halide silane or halide disilane including at least one of $SiCl_4$, $SiCl_6$, $SiCl_2H_4$, $SiF_4$ and combinations thereof. After the inorganic silicon compound is injected into the reactor, a purge gas may be injected.

A second oxidation gas is injected into the reactor. The second oxidation gas may be at least one of $O_3$, O radical, $H_2O$, $H_2O_2$ or combinations thereof. After the second oxidation gas is injected, a purge gas may be injected.

The first metal source, the first and second oxidation gases, and the inorganic silicon compound may be injected several times. After the first metal source is injected several times, the inorganic silicon compound may be injected several times. For example, the first metal source, the first and second oxidation gases, and the inorganic silicon compound may be injected in the following order: the first metal source$_l$→the first oxidation gas$_m$→the inorganic silicon compound$_n$→the second oxidation gas$_o$ (wherein l, m, n and o represent a number of injections and are natural number (or integer) of 1 or more). Alternatively the first metal source and the inorganic silicon compound are alternately injected several times. For example, the first metal source, the first and second oxidation gases, and the inorganic silicon compound may be injected in the following order: (the first metal source→the first oxidation gas)$_x$→(the inorganic silicon compound→the second oxidation gas)$_y$ (wherein x and y represent a number of injection and are natural number (or integer) of 1 or more). The number of times the first metal source is injected may be greater than the number of times the inorganic silicon compound is injected. An alternate injection of the first metal source, the first oxidation gas, the inorganic silicon compound and the second oxidation gas may be repeatedly performed. For example, a sequence (q) of the first metal source, the first oxidation gas, the inorganic silicon compound and the second oxidation gas may be repeated in the following order: (the first metal source$_l$→the first oxidation gas$_m$→the inorganic silicon compound$_n$→the second oxidation gas$_o$)$_q$ (wherein l, m, n, o and q represent a number of repetitions and are natural number (or integer) of 1 or more). An sequence (z) of the first metal source, the first oxidation gas, the inorganic silicon compound and the second oxidation gas may be repeated in order of {(the first metal source→the first oxidation gas)$_x$→(the inorganic silicon compound→the second oxidation gas)$_y$}$_z$ (wherein x, y and z represent a number of repetitions and are natural number (or integer) of 1 or more). The number of time each step is performed may be controlled depending on desired features of the layer to be formed.

The first dielectric layer 24 may be formed by injecting the first metal source and the inorganic silicon compound. The first dielectric layer 24 may be a metal silicon oxide layer.

The first dielectric layer 24 may be formed by a method capable of controlling a concentration in the layer. For example, the first dielectric layer 24 may be formed by a chemical vapor deposition (CVD) and may be formed using a precursor not including carbon. In another example, the first dielectric layer 24 may use an organic metal compound and/or an organic silicon compound as a precursor and may be formed to have a lower carbon concentration by controlling the first oxidation gas or an addition gas. The first oxidation gas may be $O_3$, and the addition gas may include nitrogen.

After the first dielectric layer 24 is formed, a subsequent process may be performed. During the subsequent process, an oxide layer 11 may be formed between the first dielectric layer 24 and the substrate 10. Depending on conditions of the subsequent process, the oxide layer 11 may be at least one of a silicon oxide layer, a silicon oxynitride or combinations thereof.

A second dielectric layer 26 is formed on the first dielectric layer 24. The second dielectric layer 26 may be a metal oxide layer. The second dielectric layer 26 may be formed by injecting a second metal source, a third oxidation gas and a purge gas into the reactor. The second metal source and the third oxidation gas may be injected several times.

The second metal source may be an organic metal compound including at least one of Hf, Zr, Al, Ti, La, Y, Gd, Ta or combinations thereof. The organic metal compound may be a metal compound including at least one carbon atom. For example, the second metal source may be at least one of $Hf[N(CH_3)_2]_4$, $Hf[N(CH_3)(C_2H_5)]_4$, $Hf[N(C_2H_5)]_4$, $Hf[OCH_3]_4$, $Hf[OC_2H_5]_4$, $Zr[N(CH_3)_2]_4$, $Zr[N(CH_3)(C_2H_5)]_4$, $Zr[N(C_2H_5)]_4$, $Zr[OCH_3]_4$, $Zr[OC_2H_5]_4$ or combinations thereof. After the second metal source is injected, a purge gas may be injected. The third oxidation gas may be at least one of $O_3$, O radical, $H_2O$, $H_2O_2$ or combinations thereof. After the third oxidation gas is injected, a purge gas may be injected.

After the second dielectric layer 26 is formed, a subsequent process may be performed. An oxide layer 11 may be formed between the first dielectric layer 24 and the substrate 10 depending on conditions of the subsequent process. The oxide layer 11 may be a silicon oxide layer, a silicon oxynitride or combinations thereof.

A gate electrode 30 may be formed on the second dielectric layer 26. After polysilicon layer is formed on the second dielectric layer 26, the polysilicon is patterned to form the gate electrode 30. However, a method of forming the gate electrode 30 is not limited to an aforementioned method.

Figure 7:
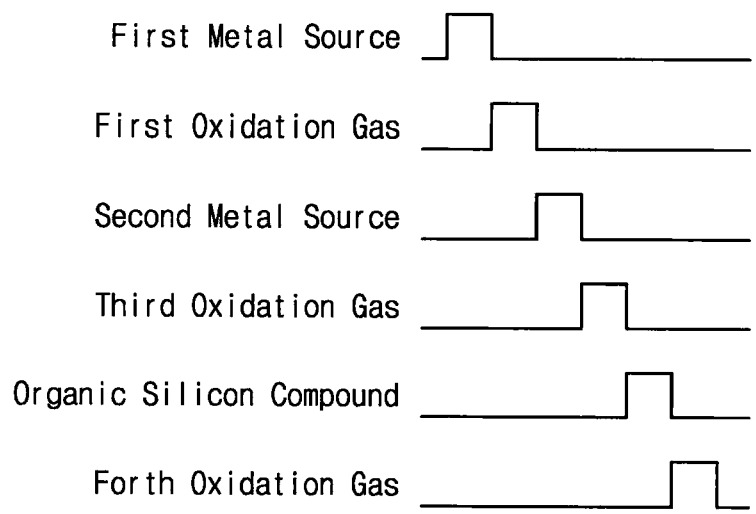

Referring to FIGS. 7, 2A and 2B, another method of forming a semiconductor device according to example embodiments will be described. A substrate 10 is loaded in a reactor. A first metal source may be injected into the reactor. The first metal source may be a metal halide inorganic compound including at least one of Hf, Zr, Al, Ti, La, Y, Gd, Ta or combinations thereof. A first oxidation gas may be injected into the reactor. The first oxidation gas may be at least one of $O_3$, O radical, $H_2O$, $H_2O_2$ or combinations thereof. After the first metal source and the first oxidation gas are injected, a purge gas may be injected. A first dielectric layer 24 may be formed on the substrate by injecting the first metal source and the first oxidation gas. The first dielectric layer 24 may be a metal oxide layer.

A second metal source and a third oxidation gas are injected in the reactor. The second metal source may be an organic metal compound including at least one of Hf, Zr, Al, Ti, La, Y, Gd, Ta or combinations thereof. The third oxidation gas may be at least one of $O_3$, O radical, $H_2O$, $H_2O_2$ or combinations thereof. After the third oxidation gas is injected, a purge gas may be injected.

An organic silicon compound may be injected into the reactor. The organic silicon compound may be a silicon compound including at least one carbon atom. The organic silicon compound may be a compound having alkyl amino group including $SiH_n(NR_1R_2)_{4-n}$ (wherein 0≤n<4). $R_1$ and $R_2$ may each independently be at least one selected from a group consisting of alkyl, allyl and combinations thereof. After the organic silicon compound is injected, a purge gas may be injected into the reactor.

A fourth oxidation gas may be injected into the reactor. The fourth oxidation gas may be at least one of $O_3$, O radical, $H_2O$, $H_2O_2$ or combinations thereof. After the fourth oxidation gas is injected, a purge gas may be injected.

The second metal source, the third and fourth oxidation gases, and the organic silicon compound may be injected several times. After the second metal source is injected several times, the organic silicon compound may be injected several times. For example, the second metal source, the third and fourth oxidation gases, and the organic silicon compound may be injected in the following order: the second metal source$_l$→the third oxidation gas$_m$→the organic silicon compound$_n$→the fourth oxidation gas$_o$ (wherein l, m, n and o represent a number of injections and are natural number (or integer) of 1 or more). Alternatively, the second metal source and the organic silicon compound are alternately injected several times. For example, the second metal source, the third and fourth oxidation gases, and the organic silicon compound may be injected in the following order: (the second metal source→the third oxidation gas)$_x$→(the organic silicon compound→the fourth oxidation gas)$_y$ (wherein x and y represent a number of injection and are natural number (or integer) of 1 or more). The number of times the second metal source is injected may be greater than the number of times the organic silicon compound is injected. An alternate injection of the second metal source, the third oxidation gas, the organic silicon compound and the fourth oxidation gas may be repeatedly performed. For example, the second metal source, the third oxidation gas, the organic silicon compound and the fourth oxidation gas may be repeated in the following orders: (the second metal source$_l$→the third oxidation gas$_m$→the organic silicon compound$_n$→the fourth oxidation gas$_o$)$_q$ (wherein q represents a number of repetitions and are natural number (or integer) of 1 or more) or {(the second metal source→the third oxidation gas)$_x$→(the organic silicon compound→the fourth oxidation gas)$_y$}$_z$ (wherein x, y and z represent a number of repetitions and are natural number (or integer) of 1 or more). The number of times the second metal source and the organic silicon compound are injected may be controlled depending on features of the layer.

A second dielectric layer 26 may be formed by injecting the second metal source, the third gas, the organic silicon compound and the fourth oxidation gas. The second dielectric layer 26 may be a metal silicon oxide layer.

After the first dielectric layer 24 and/or the second dielectric layer 26 are formed, a subsequent process may be performed. An oxide layer 11 may be formed between the first dielectric layer 24 and the substrate 10 depending on conditions of the subsequent process. The oxide layer 11 may be at least one of a silicon oxide layer, a silicon oxynitride or combinations thereof.

A gate electrode 30 is formed on the second dielectric layer 26. After polysilicon layer (not shown) is formed on the second dielectric layer 26, the polysilicon layer is patterned to form the gate electrode 30. However, a method of forming the gate electrode 30 is not limited to an aforementioned method.

Referring to FIGS. 5, 2A and 2B, another method of forming a semiconductor device according to example embodiments will be described. A substrate 10 may be loaded in a reactor. A first dielectric layer 24 may be formed on the substrate 10.

The first dielectric layer 24 may be formed by injecting a first metal source, a first oxidation gas, an inorganic silicon compound and a second oxidation gas into the reactor. The first metal source, the first oxidation gas, the inorganic silicon compound and the second oxidation gas may be injected several times, respectively.

The first metal source may be a metal halide inorganic compound including at least one metal selected from the group consisting of Hf, Zr, Al, Ti, La, Y, Gd, Ta and combinations thereof. After the first metal source is injected, a purge gas may be injected.

The first oxidation gas may be at least one of $O_3$, O radical, $H_2O$, $H_2O_2$ or combinations thereof. After the first oxidation gas is injected, a purge gas may be injected. The inorganic metal compound may be a silicon compound not including carbon. After the inorganic metal compound is injected, a purge gas may be injected. A dielectric layer 24 formed by the method described above. The dielectric layer 24 may be a metal silicon oxide layer.

A second dielectric layer 26 may be formed on the substrate including the first dielectric layer 24. The second dielectric 26 may be formed by injecting a second metal source, a third oxidation gas, an organic silicon compound and a fourth oxidation gas into the reactor. The second dielectric layer 26 may be formed by the method described above. The second dielectric layer 26 may be a metal silicon oxide layer.

The second metal source may be an organic metal compound including at least one metal selected from the group consisting of Hf, Zr, Al, Ti, La, Y, Gd, Ta and combinations thereof. After the second metal source is injected, a purge gas may be injected. The third oxidation gas may be injected in the reactor. The first and second metal sources may be compounds including different metals.

After the third oxidation gas is injected, an organic silicon compound is injected into the reactor. The organic silicon compound may be a silicon compound including at least one carbon atom. The organic silicon compound may be silane or disilane including at least one carbon atom. The organic silicon compound may be a compound having alkyl amino group including $SiH_n(NR_1R_2)_{4-n}$ (wherein $0 \leq n < 4$). $R_1$ and $R_2$ may each independently be at least one selected from a group consisting of alkyl, allyl and combinations thereof. After the organic silicon compound is injected, a purge gas may be injected into the reactor. A fourth gas is injected into the reactor. After the fourth oxidation gas is injected, a purge gas may be injected.

After the first dielectric layer 24 and/or the second dielectric layer 26 are formed, a subsequent process may be performed. An oxide layer 11 may be formed between the first dielectric layer 24 and the substrate 10 depending on conditions of the subsequent process. The oxide layer 11 may be a silicon oxide layer, a silicon oxynitride layer or combinations thereof.

A gate electrode 30 is formed on the second dielectric layer 26. After polysilicon layer (not shown) is formed on the second dielectric layer 26, the polysilicon layer is patterned to form the gate electrode 30. However, a method of forming the gate electrode 30 is not limited to an aforementioned method.

Figure 8:
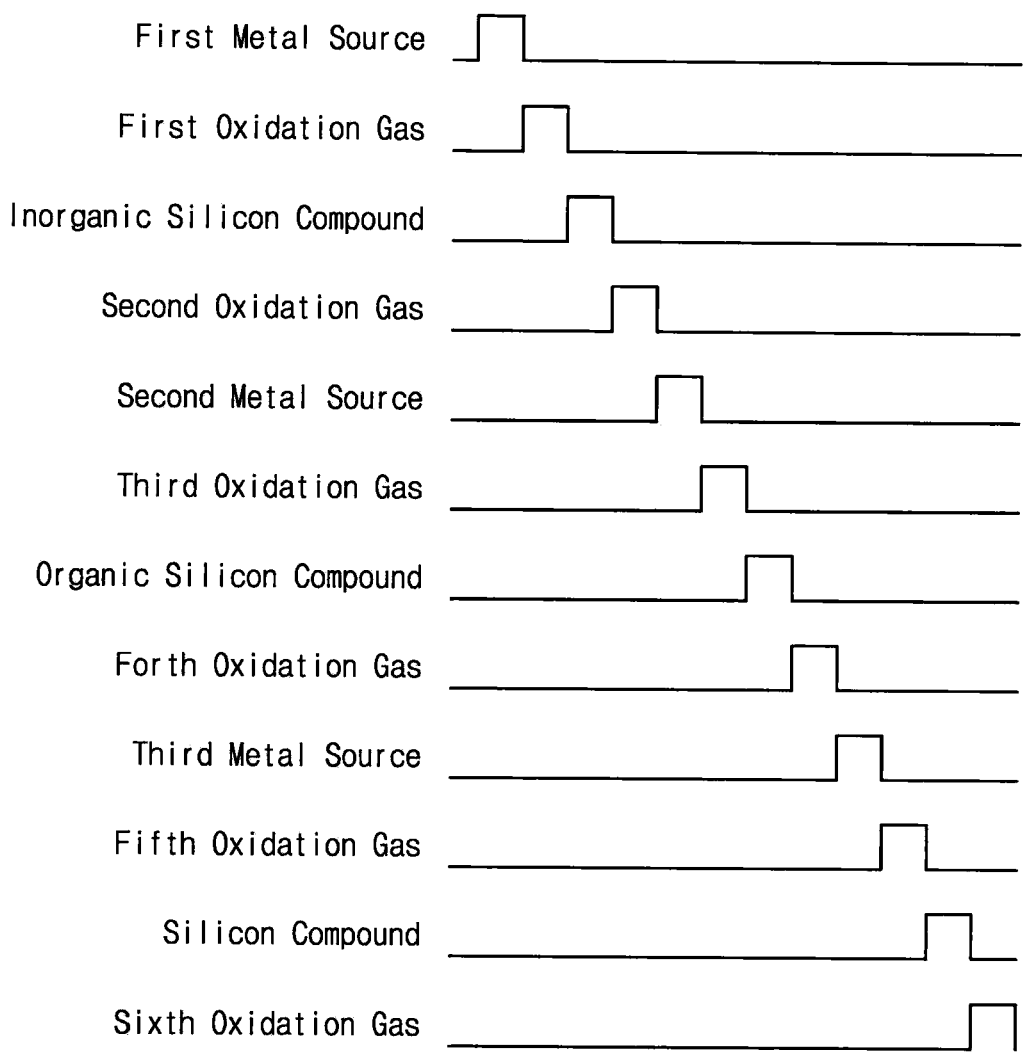

Referring to FIGS. 8, 3A and 3B, another method of forming a semiconductor device according to example embodiments will be described. A substrate 10 is loaded in a reactor. A first metal source and a first oxidation gas are injected into the reactor. The first metal source may be a metal halide inorganic compound including at least one of Hf, Zr, Al, Ti, La, Y, Gd, Ta or combinations thereof. After the first oxidation gas and the first oxidation gas are injected, a purge gas may be injected.

An inorganic silicon compound and a second oxidation gas may be injected into the reactor. The inorganic silicon compound may be halide silane or halide disilane not including carbon. After the inorganic silicon compound and/or the second oxidation gas are injected, a purge gas may be injected. The first metal source, the first and second oxidation gases, and the inorganic silicon compound may be injected several times, respectively.

A first dielectric layer 24 may be formed on the substrate 10 by injecting the first metal source, the first and second oxidation gases and the inorganic silicon compound. The first dielectric layer 24 may be a metal oxide layer or a metal silicon oxide layer depending on whether or not the inorganic silicon compound and the second oxidation gas are injected.

A second metal source and a third oxidation gas are injected into the reactor. After the second metal source and/or the third oxidation gas are injected, a purge gas may be injected.

An organic silicon compound and a fourth oxidation gas may be injected. After the organic silicon compound and the fourth oxidation gas are injected, a purge gas may be injected. The second metal source, the third and fourth oxidation gases, and the organic silicon compound may be injected several times, respectively.

A second dielectric layer 26 may be formed on the first dielectric layer 24 by injecting the second metal source, the third and fourth oxidation gases, and the organic silicon compound. The second dielectric layer 26 may be a metal oxide layer or a metal silicon oxide layer depending on whether or not the organic silicon compound and the fourth oxidation gas is injected.

A third metal source is injected into the reactor. The third metal source may be a metal compound including at least one of Hf, Zr, Al, Ti, La, Y, Gd, Ta or combinations thereof. After the third metal source is injected, a purge gas may be injected.

A fifth oxidation gas is injected into the reactor. The fifth oxidation gas may be at least one of $O_3$, O radical, $H_2O$, $H_2O_2$ or combinations thereof. After the fifth oxidation gas is injected, a purge gas may be injected.

A silicon compound and a sixth oxidation gas may be injected into the reactor. The sixth oxidation gas may be at least one of $O_3$, O radical, $H_2O$, $H_2O_2$ or combinations thereof. After the silicon compound and the sixth oxidation gas are injected, a purge gas may be injected. A third dielectric layer 26 may be formed on the second dielectric layer 24 by injecting the third metal source and the fifth oxidation gas.

The third dielectric layer 28 may be a metal oxide layer or a metal silicon oxide layer depending on whether or not the silicon compound and the sixth oxidation gas are injected. The third dielectric layer 28 may have a different carbon concentration depending on whether the third metal source and the silicon compound include carbon or not.

After the first and second dielectric layers 24 and 26, and/or the third dielectric layer 28 are formed, a subsequent process may be performed. An oxide layer 11 may be formed between the first dielectric layer 24 and the substrate 10 depending on a condition of the subsequent process. The oxide layer 11 may be at least one of a silicon oxide layer, a silicon oxynitride layer or combinations thereof.

A gate electrode 30 is formed on the second dielectric layer 26. After a polysilicon layer (not shown) is formed on the second dielectric layer 26, the polysilicon layer is patterned to form the gate electrode 30. However, a method of forming the gate electrode 30 is not limited to an aforementioned method.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A semiconductor device, comprising:
a first dielectric layer on a substrate;
a second dielectric layer on the first dielectric layer; and
a third dielectric layer on the second dielectric layer,
wherein a carbon concentration in the first dielectric layer and the third dielectric layer is lower than the second dielectric layer, and
a region in the first dielectric layer adjacent to the substrate has the lowest carbon concentration.

2. The semiconductor device of claim 1, further comprising a silicon layer between the substrate and the first dielectric layer, and the silicon layer is at least one selected from the group consisting of a silicon oxide layer, a silicon nitroxide layer and combinations thereof.

3. The semiconductor device of claim 1, wherein the first dielectric layer and the second dielectric layer include at least one selected from the group consisting of a metal oxide layer, a metal silicon oxide layer and combinations thereof.

4. The semiconductor device of claim 1, wherein the first dielectric layer and the second dielectric layer include a same metal.

5. The semiconductor device of claim 4, wherein the first dielectric layer includes an inorganic silicon compound.

6. The semiconductor device of claim 5, wherein the inorganic silicon compound is a halide silicon compound including at least one selected from the group consisting of $SiCl_4$, $SiCl_6$, $SiCl_2H_4$, $SiF_4$ and combinations thereof.

7. The semiconductor device of claim 5, wherein the second dielectric layer includes an organic silicon compound.

8. The semiconductor device of claim 7, wherein the organic silicon compound is a compound having alkyl amino group including $SiH_n(NR_1R_2)_{4-n}$ (wherein 0≤n<4), and $R_1$ and $R_2$ are each independently at least one selected from the group consisting of an alkyl, an allyl and combinations thereof.

9. The semiconductor device of claim 4, wherein the second dielectric layer includes an organic silicon compound.

10. The semiconductor device of claim 9, wherein the organic silicon compound is a compound having alkyl amino group including $SiH_n(NR_1R_2)_{4-n}$ (wherein 0≤n<4), and $R_1$ and $R_2$ are each independently at least one selected from the group consisting of an alkyl, an allyl and combinations thereof.

11. The semiconductor device of claim 4, further comprising a third dielectric layer on the second dielectric layer, the third dielectric layer having a lower carbon concentration than the second dielectric layer.

12. The semiconductor device of claim 11, wherein the first dielectric layer includes an inorganic silicon compound.

13. The semiconductor device of claim 12, wherein the inorganic silicon compound is a halide silicon compound including at least one selected from the group consisting of $SiCl_4$, $SiCl_6$, $SiCl_2H_4$, $SiF_4$ and combinations thereof.

14. The semiconductor device of claim 11, wherein the second dielectric layer includes injecting an organic silicon compound.

15. The semiconductor device of claim 14, wherein the organic silicon compound is a compound having alkyl amino group including $SiH_n(NR_1R_2)_{4-n}$ (wherein 0≤n<4), and $R_1$ and $R_2$ are each independently at least one selected from the group consisting of an alkyl, an allyl and combinations thereof.

* * * * *